(12) United States Patent
Santos Rodriguez

(10) Patent No.: US 9,793,182 B2
(45) Date of Patent: Oct. 17, 2017

(54) SEMICONDUCTOR DEVICE ARRANGEMENT AND A METHOD FOR FORMING A SEMICONDUCTOR DEVICE ARRANGEMENT

(71) Applicant: Infineon Technologies AG, Neubiberg (DE)

(72) Inventor: Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 37 days.

(21) Appl. No.: 14/484,928

(22) Filed: Sep. 12, 2014

(65) Prior Publication Data

US 2016/0079183 A1    Mar. 17, 2016

(51) Int. Cl.
| | | |
|---|---|---|
| *H01L 23/544* | (2006.01) | |
| *H01L 21/66* | (2006.01) | |
| *H01L 23/522* | (2006.01) | |
| *H01L 21/78* | (2006.01) | |
| *H01L 29/34* | (2006.01) | |
| *H01L 29/36* | (2006.01) | |
| *H01L 21/302* | (2006.01) | |
| *H01L 21/265* | (2006.01) | |
| *H01L 21/306* | (2006.01) | |

(52) U.S. Cl.
CPC ............ *H01L 22/20* (2013.01); *H01L 21/302* (2013.01); *H01L 21/30604* (2013.01); *H01L 21/78* (2013.01); *H01L 23/522* (2013.01); *H01L 29/34* (2013.01); *H01L 29/36* (2013.01); *H01L 21/26513* (2013.01); *H01L 21/306* (2013.01); *H01L 22/12* (2013.01); *H01L 2924/0002* (2013.01)

(58) Field of Classification Search
CPC ..... H01L 22/20; H01L 21/0203; H01L 29/36; H01L 29/34; H01L 23/522; H01L 21/78; H01L 2924/0002; H01L 22/12; H01L 21/26513; H01L 22/10; H01L 21/3043; H01L 2221/68327

See application file for complete search history.

(56) References Cited

U.S. PATENT DOCUMENTS 6,285,072 B1 * 9/2001 Maeda ................ H01L 21/7624
257/370
6,372,392 B1 * 4/2002 Hoshino ................ C03C 17/06
216/67

(Continued)

OTHER PUBLICATIONS

Lehmann, V., "The Electrochemical Dissolution of Silicon," regarding Chapter 4, pp. 51-75 of the Electrochemistry of Silicon book published by Wiley-VCH, 2002, 17 pp.

(Continued)

*Primary Examiner* — Julio Maldonado
*Assistant Examiner* — Stanetta Isaac
(74) *Attorney, Agent, or Firm* — Shumaker & Sieffert, P.A.

(57) ABSTRACT

A semiconductor device arrangement includes a semiconductor substrate which includes a semiconductor substrate front side and a semiconductor substrate back side. The semiconductor substrate includes at least one electrical element formed at the semiconductor substrate front side. The semiconductor device arrangement further includes at least one porous semiconductor region formed at the semiconductor substrate back side.

20 Claims, 4 Drawing Sheets

(56) References Cited

U.S. PATENT DOCUMENTS

2007/0184581 A1* 8/2007 Hsu et al. .................. 438/108
2007/0298532 A1* 12/2007 Machauf ............. B81C 1/00333
　　　　　　　　　　　　　　　　　　　　　　　438/48
2008/0280140 A1* 11/2008 Ferrari .................. C25F 3/12
　　　　　　　　　　　　　　　　　　　　　　428/402

OTHER PUBLICATIONS

Sakaguchi, K. et al., "Extremely High Selective Etching of Porous Si for Single Etch-Stop Bond-and-Etch-Back Silicon-on-Insulator," Japan Journal of Applied Physics, vol. 34, Part 1, No. 2B, Feb. 1995, pp. 842-847.

\* cited by examiner

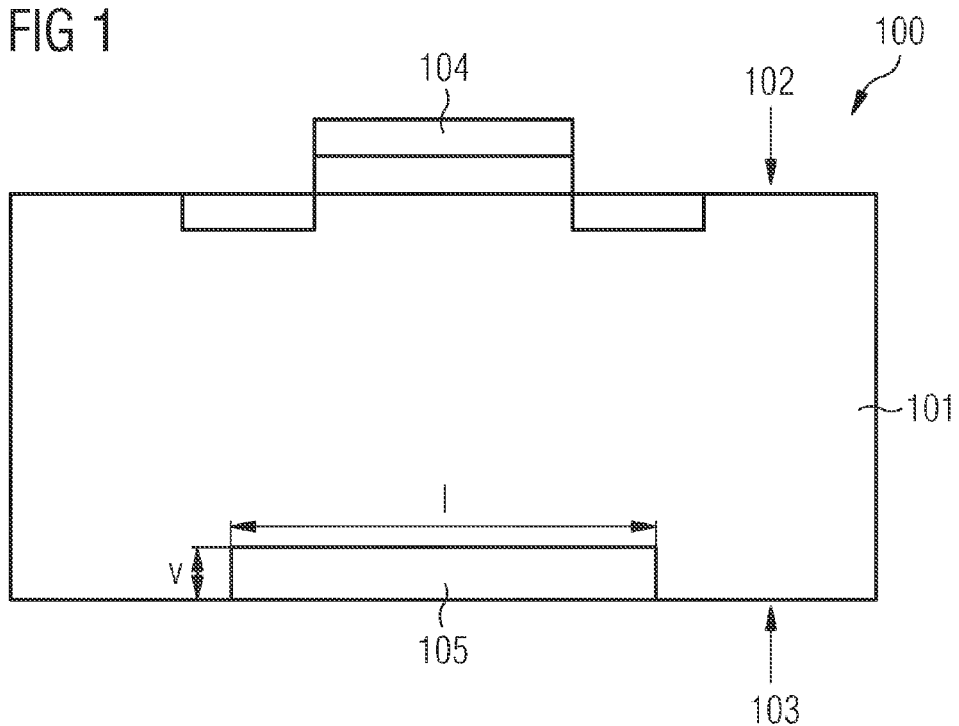
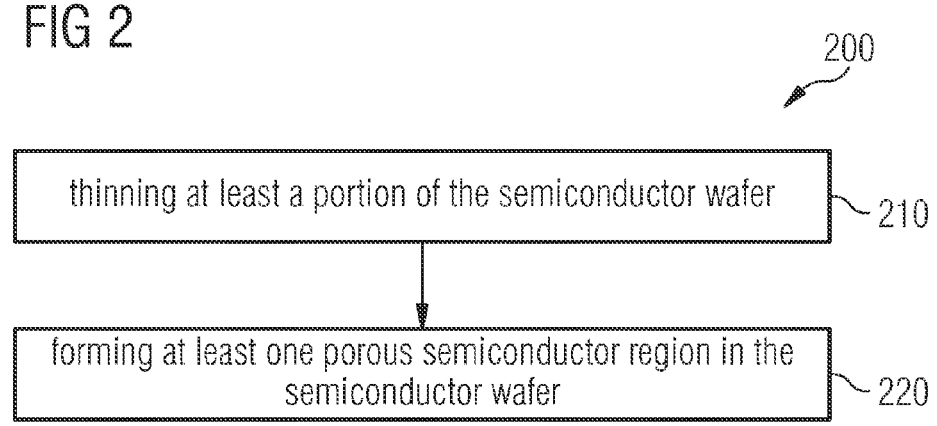

SEMICONDUCTOR DEVICE ARRANGEMENT AND A METHOD FOR FORMING A SEMICONDUCTOR DEVICE ARRANGEMENT

TECHNICAL FIELD

Embodiments relate to semiconductor substrates with porous semiconductor regions, and in particular to a semiconductor device arrangement, a method for forming a semiconductor device arrangement and a method for reducing thickness variations in a semiconductor substrate.

BACKGROUND

Various semiconductor devices make use of regions of porous semiconductor material. Porous semiconductors, e.g. porous silicon, may be created in semiconductor wafers, by electrochemical etching methods, for example. However, processing the wafers may be challenging. For example, the wafer edges of ultrathin wafers tend to be very fragile regions, which may not be able to withstand strong mechanical forces. Yield losses may be experienced due to breakage or leakages.

SUMMARY

Some embodiments relate to a semiconductor device arrangement. The semiconductor device arrangement includes a semiconductor substrate which includes a semiconductor substrate front side and a semiconductor substrate back side. The semiconductor substrate includes at least one electrical element formed at the semiconductor substrate front side. The semiconductor device arrangement further includes at least one porous semiconductor region formed at the semiconductor substrate back side.

Some embodiments relate to a method for forming a semiconductor device arrangement. The method includes thinning at least a portion of the semiconductor wafer to form a thinned wafer portion. The method further includes forming at least one porous semiconductor region in the semiconductor wafer. The semiconductor wafer includes a support structure laterally surrounding the thinned wafer portion of the semiconductor wafer.

Some embodiments relate to a method for reducing thickness variations in a semiconductor substrate. The method includes detecting at least one thickness aberration region at a side of a semiconductor substrate. The method further includes forming at least one porous semiconductor region in the at least one thickness aberration region. The method further includes selectively removing at least part of the at least one porous semiconductor region to at least partially remove the at least one thickness aberration region.

BRIEF DESCRIPTION OF THE FIGURES

Some embodiments of apparatuses and/or methods will be described in the following by way of example only, and with reference to the accompanying figures, in which FIG. 1 shows a schematic illustration of a semiconductor device arrangement;

FIG. 2 shows a flow chart of a method for forming a semiconductor arrangement;

DETAILED DESCRIPTION

Figure 3:
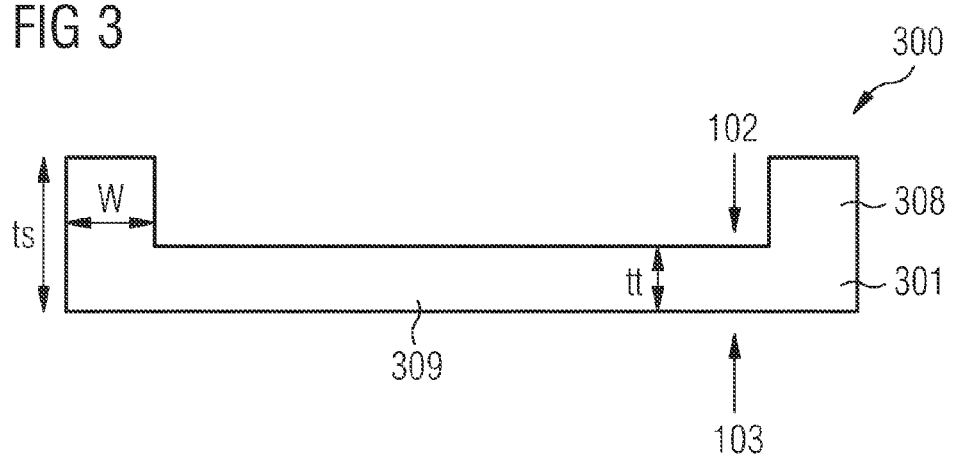
FIG. 3 shows a schematic illustration of a semiconductor device arrangement with a supporting structure.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 shows a schematic illustration of a semiconductor device arrangement 100 according to an embodiment. The semiconductor device arrangement 100 includes a semiconductor substrate 101 which includes a semiconductor substrate front side 102 and a semiconductor substrate back side 103. The semiconductor substrate 101 includes at least one electrical element 104 manufactured or formed at the semiconductor substrate front side 102. The semiconductor device arrangement 100 further includes at least one porous semiconductor region 105 formed at the semiconductor substrate back side 103.

Due to the implementation of the at least one porous semiconductor region at the semiconductor substrate back side, various properties and/or characteristics of the semiconductor devices may be improved. For example, the at least one porous semiconductor region may be used to improve an adhesion of the back side metallization to the back side, or to improve or increase carrier recombination at the back side. For example, the at least one porous semiconductor region may be used to produce higher recombination region on the backside of power devices.

The semiconductor arrangement may include a semiconductor device (e.g. a semiconductor chip) or a semiconductor wafer comprising a plurality of semiconductor devices.

The semiconductor substrate 101 may include at least part of a semiconductor chip or a semiconductor wafer. For example, the semiconductor substrate may be a silicon-based semiconductor substrate, silicon carbide-based semiconductor substrate, gallium arsenide-based semiconductor substrate or gallium nitride-based semiconductor substrate. For example, the semiconductor substrate may be a III-V semiconductor based substrate or a II-VI semiconductor based substrate.

A semiconductor substrate front side 102 or a main surface of the chip may be a surface of the substrate towards metal layers, insulation layers and/or passivation layers on top of the surface of the substrate or a surface of one of these layers. One or more electrically insulating layers and/or electrically conductive layers may be stacked on a front side of the semiconductor substrate, for example. For example, a semiconductor substrate front side 102 may be the side at which active elements (or active electrical elements) of a chip are formed or disposed. For example, in a power semiconductor chip, a semiconductor substrate front side may be a side of the chip at which a first source/drain region and a gate region (e.g. active areas) are formed, and a semiconductor substrate back side may be a side of the chip at which a second source/drain region is formed. For example, more complex structures may be located at the semiconductor substrate front side than at the semiconductor substrate back side. For example, implanted regions, grooves or trenches may be located at the semiconductor substrate front side.

The semiconductor substrate may comprise a thickness between 10 µm and 1 mm, or e.g. between 20 µm and 800 µm, or e.g. between 20 µm and 200 µm. For example, a thickness of the semiconductor substrate may be 10 µm, 20 µm, 50 µm, 100 µm, 150 µm, 170 µm, 200 µm, 600 µm or 800 µm.

The at least one porous semiconductor region 105 (which may refer to one or a plurality of porous semiconductor regions) may include a similar or the same material as the semiconductor substrate. For example, the at least one porous semiconductor region may have a similar or the same material composition as the semiconductor substrate and/or may be a porous part of the semiconductor substrate. For example, the at least one porous semiconductor region may be a porous silicon region or a porous silicon carbide region, a porous gallium arsenide region or a porous gallium nitride region.

The porous semiconductor region or regions may be formed by electrochemical or photo-electrochemical etching, e.g. anodic etching, of the semiconductor substrate. The porosity of a porous semiconductor region may be measured as a ratio of the effective pore volume (e.g. volume of the pores) in the porous semiconductor region to the total volume of the porous semiconductor region (including the semiconductor substrate volume and pore volume within the porous semiconductor region). For example, a higher porosity value may indicate a higher density of pores in the porous semiconductor region, whereas a lower porosity value may indicate a lower density of pores in the porous semiconductor region. For example, the at least one porous semiconductor region may have a porosity which lies between 5% and 95%, or between 10% and 80%, or between 25% and 60%, for example. For example, the at least one porous semiconductor region may have a density (weight per volume) of about 90%, 80% or 70% of the semiconductor material surrounding the porous semiconductor region.

For example, a minimum, maximum or average lateral dimension, l, of the porous silicon region 105 may lie between 1 nm and 100 µm. e.g. between 20 nm to 25 µm. e.g. 50 nm to 5 µm. The minimum, maximum or average lateral dimension may be a width of the porous silicon region in a direction substantially parallel to a lateral surface (e.g. a back side 103) of the semiconductor substrate, for example. For example, an average vertical dimension, v, of the porous silicon region may lie between 1 nm and 100 µm, e.g. between 20 nm to 25 µm, e.g. 50 nm to 5 µm. For example, an average vertical dimension, v, of the porous silicon region may lie between 1% to 50%, or e.g. between 3% to 30% (e.g. one-third) of the thickness of the semiconductor substrate. The average vertical dimension may be a vertical depth of the porous silicon region in a direction substantially perpendicular to a lateral surface (e.g. a back side 103) of the semiconductor wafer, averaged over the lateral extension of the porous silicon region, for example.

The semiconductor substrate 101 may include at least one electrical element 104 manufactured or formed at the semiconductor substrate front side 102. In other words, the at least one electrical element 104 may be disposed at the semiconductor substrate front side 102. The electrical element 104 may be a transistor or a diode or may include one or more integrated circuit devices disposed at the semiconductor substrate front side, for example. For example, the semiconductor substrate may be a power semiconductor chip or a CMOS semiconductor chip. An integrated circuit device may include for example, one or more transistors e.g. a power transistor, metal oxide semiconductor field effect transistor (MOSFET) or insulated gate bipolar transistor (IGBT), and/or one or more diodes.

FIG. 2 shows a flow chart of a method 200 for forming a semiconductor device arrangement according to an embodiment.

The method 200 may include thinning 210 at least a portion of the semiconductor wafer to form a thinned wafer portion.

The method 200 may further include forming 220 at least one porous semiconductor region in the semiconductor wafer. The semiconductor wafer may include a support structure laterally surrounding the thinned wafer portion of the semiconductor wafer.

Due to the implementation of a support structure, a porous semiconductor region may be implemented on the back side of the semiconductor substrate with reduced risk of damages.

More details and aspects are mentioned in connection with embodiments described above or below (e.g. regarding the semiconductor substrate, the thinned wafer portion and the porous semiconductor region). The embodiments described in FIG. 2 may comprise one or more optional additional features corresponding to one or more aspects mentioned in connection with the proposed concept or one or more embodiments described above (e.g. FIG. 1) or below (e.g. FIGS. 3 to 9C).

FIG. 3 shows an example of a thinned semiconductor wafer 301 and having a support structure 308. The semiconductor wafer 301 may be thinned, for example by grinding, etching (e.g. dry or wet etching), or laser ablation, or a combination of these methods, for example. The semiconductor wafer 301 may be similar or have similar properties as the semiconductor substrate described with respect to FIG. 1. The semiconductor wafer 301 may be thinned by grinding (e.g. back grinding) a semiconductor wafer. While grinding the wafer, an edge region may be left at the outer most circumference of the wafer. The support structure 308 may include or may be at least part of a remaining portion, e.g. the remaining edge region, of the semiconductor wafer outside the thinned wafer portion 309. An average width, w, (e.g. a shortest distance between a point on the outer circumference of the support structure 308 of the semiconductor wafer and an inner circumference of the support structure 308 of the semiconductor wafer) may lie between 2 mm to 8 mm, e.g. 2 mm to 5 mm, e.g. approximately 3 mm, for a semiconductor wafer having a notch at its outer circumference, for example. For a notchless semiconductor wafer, an average width, w, may lie between 0.5 mm to 5 mm, e.g. between 0.5 mm to 3 mm, e.g. approximately 1 mm. As the thinning grinds or removes semiconductor material within the inner circumference, the thinned wafer portion may have a smaller thickness than the support structure. For example, an average original thickness ts, of the semiconductor wafer may lie between 300µm to 1200 µm, or e.g. between 600 µm to 850 µm. After thinning, the thinned wafer portion 309 may have an average thickness tt, which lies between 10 µm to 220 µm, e.g. between 30 µm to 150 µm, e.g. 30 µm to 100 µm. Therefore, at least part of the semiconductor wafer 301 may have a thickness which lies between 10 µm and 220 µm, for example. For example, the support structure 308 may have a thickness more than two times greater than the thinned wafer portion 309. The thickness of the support structure 308 may be similar or equal to a thickness of the original semiconductor wafer 301, e.g. before the thinning process. The thinned wafer portion 309 may take up 50% to 99%, e.g. 80% to 98%, e.g. 90% to 95% of the area of the semiconductor wafer 101, for example.

The semiconductor wafer 301 may be grinded from a back side of the semiconductor wafer. For example, if one or more electrical elements are already formed at a wafer front side, then the semiconductor wafer may be thinned from a wafer back side, after the formation of the one or more electrical elements.

Due to the implementations of e.g. a selective grinding of the wafer and leaving a remaining portion of the semiconductor wafer as the support structure, the risk of thin wafer handling may be lowered and thinned semiconductor wafer warpage may also be reduced. Furthermore, a thinned semiconductor may improve the performance of power semiconductor chips.

In another implementation of the embodiment, the support structure may include a polymer, glass or silicon arranged at an edge region at the back side or the front side of the semiconductor wafer. For example, the support structure may be added along and/or around an outer most circumference of the original semiconductor wafer. For example, polymer material, e.g. thick film polymers, may be deposited around the outer circumference of the semiconductor wafer as the support structure, for example, by coating and/or printing on or along at least the wafer edge. In another example, a glass and/or silicon support ring may be glued on the wafer edge around the outer circumference as the support structure.

After the formation of the support structure, e.g. the backside support ring, the semiconductor wafer may be thinned and the electrochemical process for the formation of porous silicon may be implemented, for example. The at least one porous semiconductor region 105 may be formed by anodic etching at least part of the thinned portion 309 of the semiconductor substrate 101, for example, by anodic etching in hydrofluoric acid (HF). For example, the at least one porous semiconductor region 105 may be formed at a same side (e.g. a back side 103) of the semiconductor wafer 101 as the support structure 308. Due to the various implementations of the above method (e.g. adding support structures to the semiconductor wafer or to an ultra-thin semiconductor wafer, and/or using a remaining portion of the semiconductor wafer as the support structure, e.g. an in situ mechanical stabilization region), the mechanical stability of the thinned semiconductor wafer may be increased. Furthermore, it may be possible to seal the wafer edge without dealing with sharp fragile edges, which may be found in thin or ultra-thin wafers without mechanical support or high yield losses.

More details and aspects are mentioned in connection with embodiments described above or below (e.g. regarding the semiconductor substrate, the thinned wafer portion, the plurality of chips and chip regions, and the porous semiconductor region). The embodiments described in FIG. 3 may comprise one or more optional additional features corresponding to one or more aspects mentioned in connection with the proposed concept or one or more embodiments described above (e.g. FIGS. 1 to 2) or below (e.g. FIGS. 4 to 9C).

Figure 4:
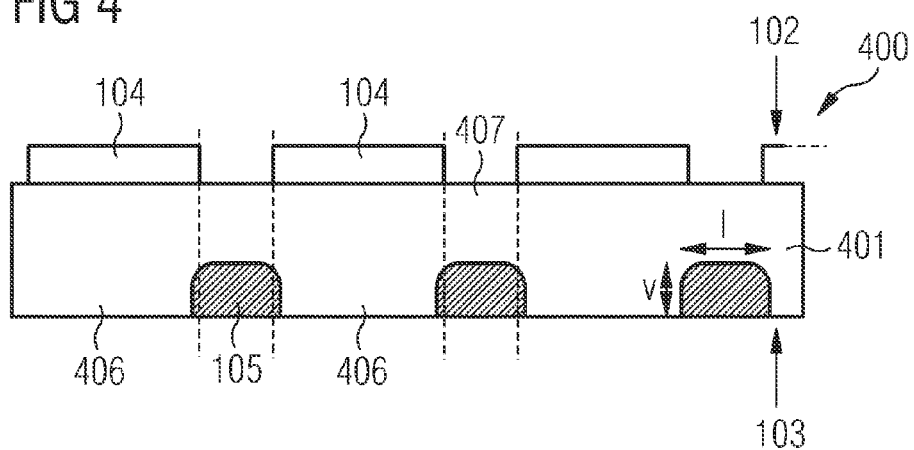
FIG. 4 shows a schematic illustration of a semiconductor device arrangement having at least one porous semiconductor region in at least one semiconductor substrate kerf region.

FIG. 4 shows a schematic illustration of a semiconductor device arrangement 400 according to an embodiment.

The semiconductor substrate 401 may include or be at least part of a semiconductor wafer or a semiconductor wafer with a thinned wafer portion, for example.

The semiconductor substrate 401 may include at least one chip or chip regions 406 (e.g. a plurality of chips or a plurality of chip regions) which may include at least one electrical element 104 formed at the chip front side 102 and at least one porous semiconductor region 105 formed at the chip back side 103. A chip or a chip region 406 refers to a part of the semiconductor substrate where at least one electrical element 104 or integrated circuit device may be formed, for example. The regions between the plurality of chips, or between the chip regions 406, may be the kerf regions 407 or sawing streets, which are the regions through which the plurality of chips are separated from each other, for example. In the semiconductor device arrangement 400, the at least one porous semiconductor region 105 may be formed at least partially in the kerf region 407 between the plurality of chips 406. For example, the porous semiconductor region 105 may extend throughout the whole width of the kerf region 407. In other words, the lateral dimensions of the porous silicon region may be larger than a width of the kerf region 407, for example.

For example, a method for forming the semiconductor arrangement 400 may further include forming the at least one porous semiconductor region in a kerf region 407 between chip regions 408 of the semiconductor substrate 401, and subsequently individualizing the chip regions by separating the chip regions 406 through the at least one porous semiconductor region 105, e.g. by dicing vertically through the semiconductor substrate in the sawing street.

Due to the formation the porous silicon over or at least partially in the dicing street region, the porous silicon region may act as a chipping stopper during the dicing process at the end of processing. Therefore the quality of individualized chips may be improved as the porous silicon region may reduce chipping of the chip due to dicing.

More details and aspects are mentioned in connection with embodiments described above or below (e.g. regarding the semiconductor substrate, the thinned wafer portion and the porous semiconductor region). The embodiments described in FIG. 4 may comprise one or more optional additional features corresponding to one or more aspects mentioned in connection with the proposed concept or one or more embodiments described above (e.g. FIG. 1 to 3) or below (e.g. FIGS. 5 to 9C)

Figure 5:
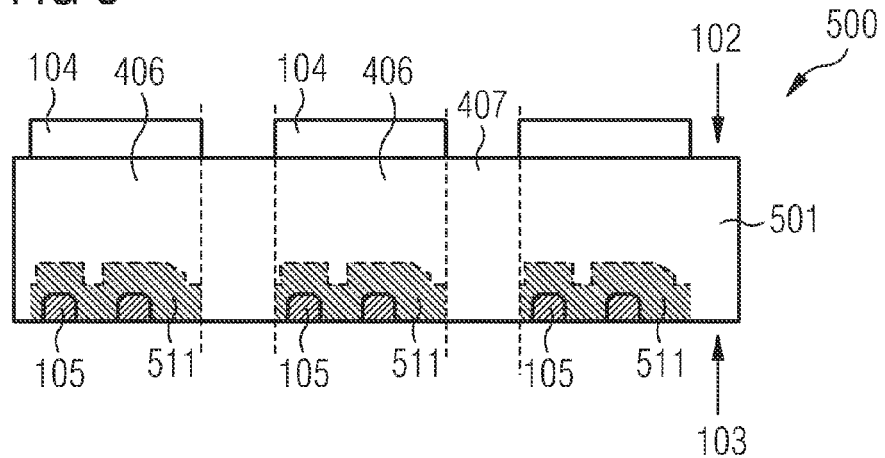
FIG. 5 shows a schematic illustration of a semiconductor device arrangement with at least one dopant region.

FIG. 5 shows a schematic illustration of a semiconductor device arrangement 500 according to an embodiment.

The semiconductor substrate 501 may include or be at least part of a semiconductor wafer or a semiconductor wafer with a thinned wafer portion, for example. The semiconductor substrate 501 may comprise a plurality of chip regions 406. Each chip region 406 may include at least one electrical element 104 manufactured or formed at the semiconductor substrate front side 102 and at least one porous semiconductor region 105 formed at the semiconductor substrate back side 103.

The at least one porous semiconductor region 105 may be formed at a back side 103 of the semiconductor substrate 501 or at a back side 103 of the thinned wafer portion of the semiconductor wafer.

Furthermore, at least one dopant may be introduced into the semiconductor wafer 501 or into a thinned wafer portion of the semiconductor substrate 501, e.g. via a back side 103 of the semiconductor substrate 501 or the thinned wafer portion to form at least one dopant region 511. For example, the dopant may be introduced by implantation, e.g. ion implantation. The dopant may include boron, phosphorus or arsenic, for example. The at least one porous semiconductor region 105 may selectively vary a diffusion rate of dopants passing through the at least one porous semiconductor region while introducing the dopant. For example, the at least one porous semiconductor region 105 may have a higher diffusion rate of dopants passing through the at least one porous semiconductor region than the surrounding semiconductor material of the thinned wafer portion while introducing the dopant. For example, due to the porous semiconductor region 105 being more porous than regions of the semiconductor substrate without the porous semiconductor regions, dopant may diffuse more quickly through the porous semiconductor region 105 than through the regions of the semiconductor substrate without the porous semiconductor regions. The semiconductor device arrangement may therefore include a dopant region extending to a varying depth from the semiconductor substrate back side. For example, the dopant region may reach deeper into the semiconductor substrate at a part of the semiconductor substrate which includes the at least one porous semiconductor region than at a part of the semiconductor substrate without the at least one porous semiconductor region.

Due to the implementation of forming a porous semiconductor region before a back side implantation, a doping region with varying depth may be enabled. The porous silicon region may be located under a device drain region (e.g. under a backside emitter in the case where the at least one electrical element is an IGBT or diode), and may function as a type of hard mask. This may generate doped regions at different depths from the back side of the semiconductor substrate, even though the same implantation dose may be applied uniformly to the back side 103. Furthermore, this may change the emitter surface and therefore the efficiency of the emitter of the electrical element, for example.

More details and aspects are mentioned in connection with embodiments described above or below (e.g. regarding the semiconductor substrate, the thinned wafer portion and the porous semiconductor region). The embodiments described in FIG. 5 may comprise one or more optional additional features corresponding to one or more aspects mentioned in connection with the proposed concept or one or more embodiments described above (e.g. FIG. 1 to 4) or below (e.g. FIGS. 6 to 9C)

Figure 6:
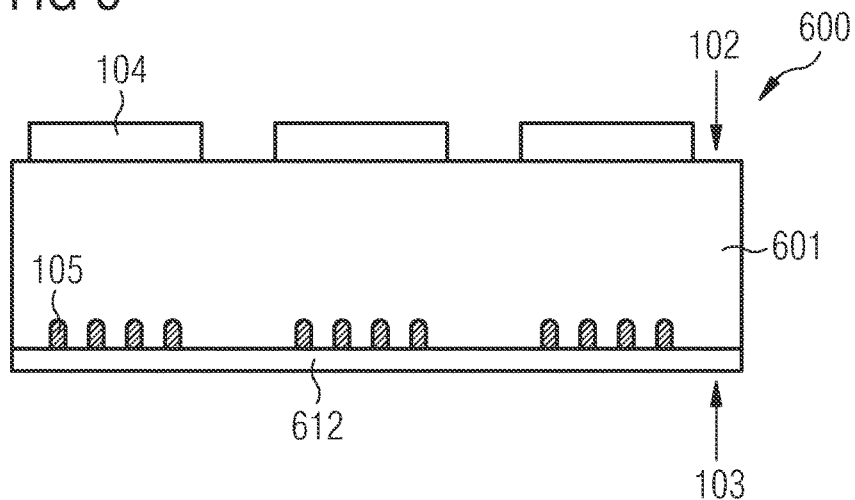
FIG. 6 shows a schematic illustration of a semiconductor device arrangement with a back side metallization layer.

FIG. 6 shows a schematic illustration of a semiconductor device arrangement 600 according to an embodiment.

The semiconductor substrate 601 may include or be at least part of a semiconductor wafer or a semiconductor wafer with a thinned wafer portion, for example. The semiconductor substrate 601 may comprise a plurality of chip regions. Each chip region may include at least one electrical element 104 manufactured or formed at the semiconductor substrate front side 102 and at least one porous semiconductor region 105 formed at the semiconductor substrate back side 103.

The semiconductor device arrangement 600 may include a back side metallization layer 612. The back side metallization layer 612 may be formed over or on the semiconductor substrate back side 103 or the back side of the thinned wafer portion, for example. For example, the back side metallization layer 612 may at least partially cover the at least one porous semiconductor region 105 and/or the wafer back side 103. For example, the back side metallization layer 612 may include any electrically conductive material, e.g. aluminum Al, titanium Ti, tungsten W, nickel Ni or copper Cu, or alloys or combinations of these materials, or alloys containing silicon or other elements such as nitrogen N or vanadium V, and may be deposited for example by evaporation or sputtering. The back side metallization layer 612 may be a back side contact, which may be in electrical contact with a drain or an emitter of an electrical element formed at the front side of the semiconductor substrate, for example.

In an implementation of the embodiment, the back side metallization layer 612 may be deposited indirectly or directly onto the back side 103 of the semiconductor substrate 601, (e.g. of the semiconductor arrangements described above).

Additionally or optionally, the individual chip regions may then subsequently be diced or individualized after the deposition of the back side metallization layer 612, for example.

Due to the formation of the back side metallization over the at least one porous semiconductor region at the back side of the semiconductor substrate, adhesion of further layers to the semiconductor substrate, e.g. to the back side, may be improved due to locally increasing the surface area.

More details and aspects are mentioned in connection with embodiments described above or below (e.g. regarding the semiconductor substrate, the thinned wafer portion, the doped regions and the porous semiconductor region). The embodiments described in FIG. 6 may comprise one or more optional additional features corresponding to one or more aspects mentioned in connection with the proposed concept or one or more embodiments described above (e.g. FIG. 1 to 5) or below (e.g. FIGS. 7 to 9C)

Figure 7:
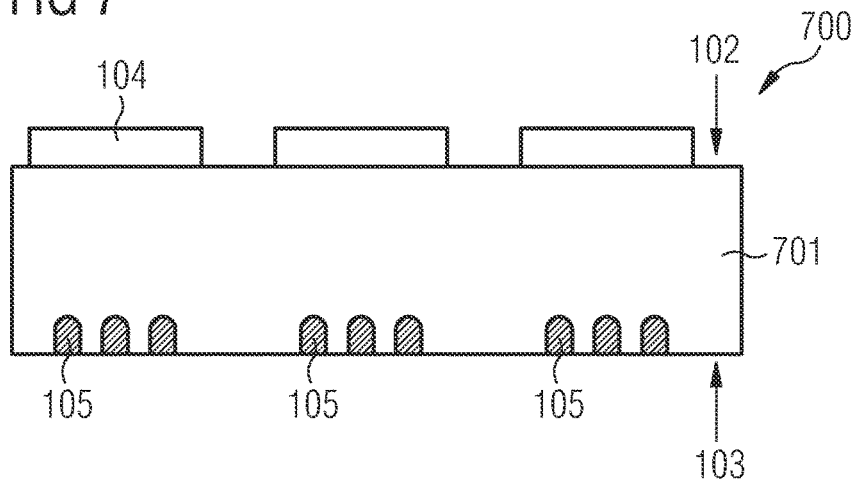
FIG. 7 shows a schematic illustration of a semiconductor device arrangement having at least one porous semiconductor region.

FIG. 7 shows a schematic illustration of a semiconductor device arrangement 700 according to an embodiment.

The semiconductor substrate 701 may include or be at least part of a semiconductor wafer or a semiconductor wafer with a thinned wafer portion, for example. The semiconductor substrate 101 may include at least one electrical element 104 manufactured or formed at the semiconductor substrate front side 102 and at least one porous semiconductor region 105 formed at the semiconductor substrate back side 103.

Due to the formation of the at least one porous semiconductor region at the back side of the semiconductor substrate, a higher recombination region on the back side of power devices manufactured or formed in the semiconductor substrate may be enabled, for example.

In other examples, the at least one porous semiconductor region 105 may be formed in a semiconductor chip region neighboring the kerf regions or in the proximity of the kerf regions at the semiconductor substrate back side 103. For example, the at least one porous semiconductor region 105 may be formed at the edges of a semiconductor chip region between an active region of a semiconductor device (e.g. center region of semiconductor die comprising active elements, e.g. transistors) and a kerf region at the semiconductor substrate back side 103. The at least one porous semiconductor region may prevent or reduce chipping at the semiconductor chip edge or periphery regions by functioning as a chipping stopper against chipping caused by sawing or dicing of the semiconductor chips during the individualization process, for example.

More details and aspects are mentioned in connection with embodiments described above or below (e.g. regarding the semiconductor substrate, the thinned wafer portion, the doped regions and the porous semiconductor region). The embodiments described in FIG. 7 may comprise one or more optional additional features corresponding to one or more aspects mentioned in connection with the proposed concept or one or more embodiments described above (e.g. FIG. 1 to 6) or below (e.g. FIGS. 8 to 9C)

Figure 8:
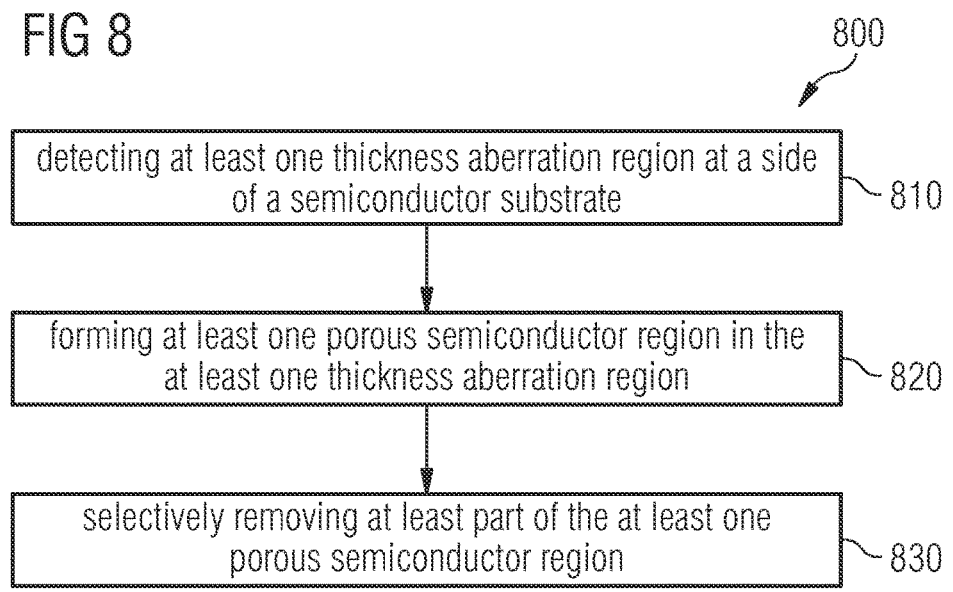
FIG. 8 shows a flow chart of a method for reducing thickness variations in a semiconductor substrate.

FIG. 8 shows a flow chart of a method 800 for reducing thickness variations in a semiconductor substrate according to an embodiment.

The method 800 may include detecting 810 at least one thickness aberration region at a side of a semiconductor substrate.

The method 800 may further include forming 820 at least one porous semiconductor region in the at least one thickness aberration region.

The method 800 may further include selectively removing at least part of the at least one porous semiconductor region to at least partially remove the at least one thickness aberration region.

Due to the transformation of uneven parts of the surface of the semiconductor substrate into porous silicon regions and the removal of the porous silicon regions at uneven parts of the surface of the semiconductor substrate, uniformity of the semiconductor substrate may be improved or increased. For example, the total thickness variation (TTV) values of a semiconductor wafer surface may be reduced.

More details and aspects are mentioned in connection with embodiments described above or below (e.g. regarding the semiconductor substrate, the thinned wafer portion, the doped regions and the porous semiconductor region). The embodiments described in FIG. 8 may comprise one or more optional additional features corresponding to one or more aspects mentioned in connection with the proposed concept or one or more embodiments described above (e.g. FIG. 1 to 7) or below (e.g. FIGS. 9A to 9C)

Figure 9A:
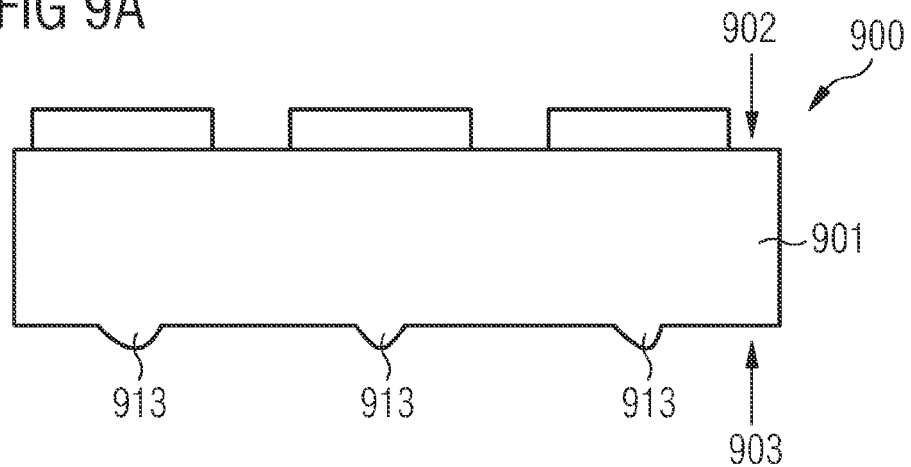
FIGS. 9A to 9C shows schematic illustrations of a method for reducing thickness variations in a semiconductor substrate.
Figure 9B:
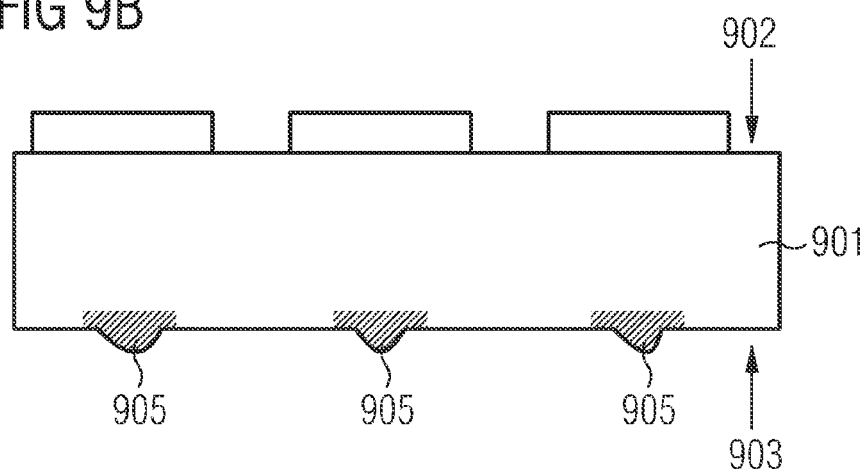
Figure 9C:
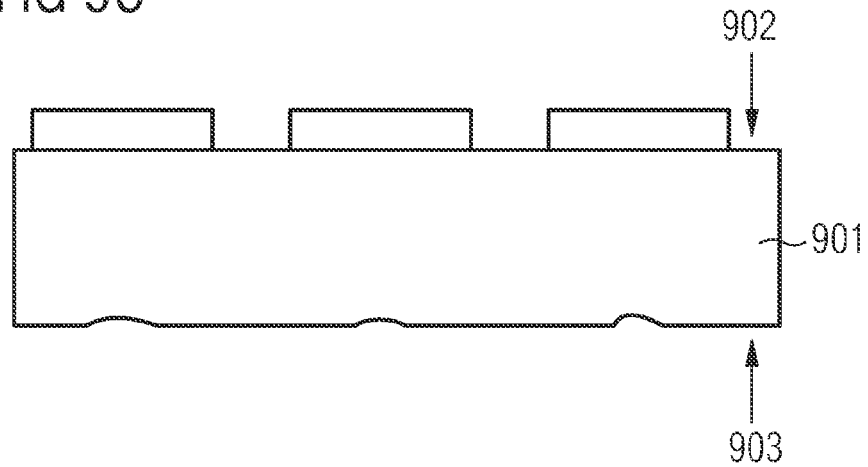

FIGS. 9A to 9C show a schematic illustration of a method for reducing thickness variations in a semiconductor substrate according to an embodiment.

FIG. 9A shows a semiconductor substrate 901 having a non-uniform thickness and thickness aberration regions 913. The semiconductor substrate 901 may include or be at least part of a semiconductor wafer or a semiconductor wafer with a thinned wafer portion, for example. For example, the at least one thickness aberration region may be at a front side 902 or a back side 903 of the semiconductor substrate 901. For thinned wafers, the thickness aberration regions may be detected at a back side of a thinned wafer portion of the semiconductor substrate 901, for example. As shown in FIG. 9A, at least one electrical element may be manufactured or formed at a front side 902 of the semiconductor substrate 901, and the method may be implemented to reduce thickness variations at a back side 903 of the semiconductor substrate 901. The detection of the at least one thickness aberration region may be carried out by using a scanner mapping macroscopic regions to identify uneven spots with non-uniform thicknesses. For example, optical or infrared mapping techniques may be used to identify the uneven regions, for example. The thickness aberration regions 913 may have an average lateral dimension which lies between 1 nm and 50 µm, or e.g. between 20 nm to 25 µm, or e.g. 50 nm to 5 µm, for example.

As shown in FIG. 9B, subsequently, porous semiconductor regions 905 may be selectively formed at or on non-uniform regions. e.g. the thickness aberration region 913. For example, the thickness aberration regions 913 may be etched to transform the thickness aberration regions 913 into porous semiconductor regions 905.

As shown in FIG. 9C, subsequently, the porous semiconductor regions 905 may be selectively removed, e.g. chemically etched, from the semiconductor wafer 901. The locally formed porous semiconductor regions 905 may be selectively etched against bulk silicon using appropriate etchants, such as a mixture of HF, hydrogen peroxide ($H_2O_2$) and deionized water ($H_2O$), for example. For example the ratio of HF:$H_2O_2$ may be approximately 1:5. Additionally or alternatively, other chemical mixtures or different ratios may be used to form the porous semiconductor regions, for example.

More details and aspects are mentioned in connection with the embodiments described above (e.g. regarding the semiconductor substrate, the thinned wafer portion and the porous semiconductor region). The embodiments shown in FIGS. 9A to 9C may comprise one or more optional additional features corresponding to one or more aspects mentioned in connection with the proposed concept or one or more embodiments described above (e.g. FIGS. 1 to 8)

Some embodiments relate to a method for forming porous silicon on the back side of already thinned ultra-thin wafers, e.g. semiconductor wafers with an average thickness lower or equal than 220 µm. Some embodiments relate to a carrier system which may have an in situ mechanical stabilization region produced (e.g. using a TAIKO process for grinding semiconductor material from a semiconductor wafer and leaving a support structure), thereby making it possible to seal the wafer edge without dealing with sharp fragile edges or high yield losses.

Some embodiments relate to combining the mechanical stability of already thinned ultrathin wafers with an electrochemical etching to generate porous silicon on thinned ultrathin wafers.

Some embodiments relate to the processing of silicon, silicon carbide, gallium nitride, and/or other III-V and/or II-VI thinned ultrathin devices, using a mechanical support structure or ring to form porous semiconductor regions.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device arrangement comprising:
    a semiconductor substrate comprising a semiconductor substrate front side and a semiconductor substrate back side, wherein the semiconductor substrate comprises at least one electrical element formed at the semiconductor substrate front side; and
    a plurality of porous semiconductor regions formed at the semiconductor substrate back side,
    wherein a density of the porous semiconductor regions is less than a density of non-porous semiconductor material separating the porous semiconductor regions.

2. The semiconductor device arrangement according to claim 1, wherein at least part of the semiconductor substrate has a thickness which lies between 10 µm and 220 µm.

3. The semiconductor device arrangement according to claim 1, wherein the plurality of porous semiconductor regions have a porosity which lies between 5% and 95%.

4. The semiconductor device arrangement according to claim 1, wherein the semiconductor substrate comprises a plurality of chips, each chip comprising at least one electrical element at the semiconductor substrate front side, and wherein the plurality of porous semiconductor regions are formed in kerf regions between the plurality of chips.

5. The semiconductor device arrangement according to claim 1, wherein the semiconductor substrate comprises at least one chip comprising the at least one electrical element formed at a chip front side and at least one porous semiconductor region of the plurality of porous semiconductor regions formed at a chip back side.

6. The semiconductor device arrangement according to claim 1, further comprising a back side metallization layer formed over the semiconductor substrate back side, wherein the back side metallization layer at least partially covers the plurality of porous semiconductor regions.

7. The semiconductor device arrangement according to claim 1, wherein a lateral dimension of the plurality of porous semiconductor regions lies between 1 nm and 100 µm.

8. The semiconductor device arrangement according to claim 1, further comprising a dopant region extending to a varying depth from the semiconductor substrate back side, wherein the dopant region reaches deeper into the semiconductor substrate at a part of the semiconductor substrate comprising the plurality of porous semiconductor regions than at a part of the semiconductor substrate that includes the non-porous semiconductor material.

9. A method for forming a semiconductor device arrangement, the method comprising:
   thinning at least a portion of the semiconductor wafer to form a thinned wafer portion, wherein the thinned wafer portion extends over more than 50% of an area of the semiconductor wafer; and
   forming a plurality of porous semiconductor regions in the semiconductor wafer, wherein the semiconductor wafer comprises a support structure laterally surrounding the thinned wafer portion of the semiconductor wafer; and
   individualizing chip regions of the thinned wafer portion by separating the chip regions through the plurality of porous semiconductor regions, wherein the plurality of porous semiconductor regions are formed in kerf regions between the chip regions of the thinned wafer portion, or
   introducing a dopant into the thinned wafer portion via a back side of the thinned wafer portion to form a dopant region, wherein the plurality of porous semiconductor regions comprise a higher diffusion rate of dopants passing through the plurality of porous semiconductor regions than a surrounding semiconductor material of the thinned wafer portion while introducing the dopant, wherein the plurality of porous semiconductor regions are formed at a back side of the thinned wafer portion of the semiconductor wafer.

10. The method according to claim 9, wherein the thinned wafer portion has a thickness which lies between 10 µm and 220 µm after thinning.

11. The method according to claim 9, wherein the portion of the semiconductor wafer is thinned so that the thinned wafer portion has a smaller thickness than the support structure, wherein the support structure comprises at least part of a remaining portion of the semiconductor wafer outside the thinned wafer portion.

12. The method according to claim 9, wherein the support structure comprises a polymer, glass or silicon arranged at an edge region of the semiconductor wafer.

13. The method according to claim 9, comprising forming the plurality of porous semiconductor regions by anodic etching at least part of the thinned portion of the semiconductor substrate.

14. The method according to claim 9, comprising forming the plurality of porous semiconductor regions at a same side of the semiconductor wafer as the support structure.

15. The method according to claim 9, wherein the support structure has a thickness more than two times greater than the thinned wafer portion.

16. The method according to claim 9, further comprising forming a back side metallization layer over the back side of the thinned wafer portion, wherein the back side metallization layer at least partially covers the plurality of porous semiconductor regions.

17. A method for reducing thickness variations in a semiconductor substrate, the method comprising:
   detecting at least one thickness aberration region at a side of a semiconductor substrate;
   forming at least one porous semiconductor region in the at least one thickness aberration region; and
   selectively removing at least part of the at least one porous semiconductor region to at least partially remove the at least one thickness aberration region.

18. The semiconductor device arrangement according to claim 1, wherein a vertical dimension of the plurality of porous semiconductor regions lies below 50% of a thickness of the semiconductor substrate.

19. The semiconductor device arrangement according to claim 1, wherein the at least one electrical element comprises a transistor or a diode.

20. The semiconductor device arrangement according to claim 1, wherein the density of the porous semiconductor regions is between 70% and 90% of the density of the non-porous semiconductor material separating the porous semiconductor regions.

* * * * *